(12) United States Patent
Rhee et al.

(10) Patent No.: US 10,916,436 B2
(45) Date of Patent: Feb. 9, 2021

(54) PLASMA DICING METHOD

(71) Applicant: SAMSUNG ELECTRONICS CO., LTD., Suwon-si (KR)

(72) Inventors: Choongho Rhee, Anyang-si (KR); Sungchan Kang, Hwaseong-si (KR); Hyunwook Kang, Hwaseong-si (KR); Cheheung Kim, Yongin-si (KR); Yongseop Yoon, Seoul (KR); Jaehyung Jang, Anyang-si (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/696,513

(22) Filed: Nov. 26, 2019

(65) Prior Publication Data
US 2021/0013043 A1   Jan. 14, 2021

(30) Foreign Application Priority Data

Jul. 8, 2019   (KR) .................. 10-2019-0082230

(51) Int. Cl.
*H01L 21/306*   (2006.01)
*H01L 21/3065*   (2006.01)
*H01L 21/56*   (2006.01)
*H01L 21/683*   (2006.01)
*H01L 21/02*   (2006.01)
(Continued)

(52) U.S. Cl.
CPC .... *H01L 21/3065* (2013.01); *H01L 21/02019* (2013.01); *H01L 21/31116* (2013.01); *H01L 21/32136* (2013.01); *H01L 21/568* (2013.01); *H01L 21/6836* (2013.01); *H01L 2221/68327* (2013.01)

(58) Field of Classification Search
CPC ............ H01L 21/3065; H01L 21/6836; H01L 21/568; H01L 21/02019; H01L 2221/68327
USPC ................ 438/700, 706, 708, 709, 718, 719
See application file for complete search history.

(56) References Cited

U.S. PATENT DOCUMENTS 6,515,309 B1 *   2/2003   Tohyama et al. ....... H01L 21/78
                                                438/114
7,897,485 B2 *   3/2011   Parekh .................... H01L 21/78
                                                438/462
(Continued)

FOREIGN PATENT DOCUMENTS

| JP | 2004-186255 A | 7/2004 |
| JP | 2005-197436 A | 7/2005 |
| KR | 10-2016-0026860 A | 3/2016 |

*Primary Examiner* — Duy Vu N Deo
(74) *Attorney, Agent, or Firm* — Sughrue Mion, PLLC

(57) ABSTRACT

Provided is a plasma dicing method. The plasma dicing method includes: performing plasma etching on a first surface of a substrate exposed between a plurality of membrane structures; forming a passivation layer on a semiconductor wafer to cover the plurality of membrane structures and at least one trench; performing plasma etching on a second surface of the substrate such that a through hole exposing a portion of the plurality of membrane structures and a dicing lane connected to the trench and having a width less than a width of the through hole are formed at the substrate; and removing the passivation layer and singulating the semiconductor wafer into a plurality of devices including a membrane partially exposed by the through hole.

16 Claims, 14 Drawing Sheets

(51) Int. Cl.
*H01L 21/311* (2006.01)
*H01L 21/3213* (2006.01)

(56) References Cited

U.S. PATENT DOCUMENTS

| | | | |
|---|---|---|---|
| 8,569,115 B1* | 10/2013 | Golda | B32B 38/18 |
| | | | 438/130 |
| 9,673,080 B2 | 6/2017 | Takahashi | |
| 2007/0278181 A1* | 12/2007 | Tsuboi | B41J 2/1609 |
| | | | 216/58 |
| 2011/0039365 A1 | 2/2011 | Utsumi et al. | |
| 2012/0322238 A1 | 12/2012 | Lei et al. | |
| 2016/0071733 A1* | 3/2016 | Ono | H01L 21/3065 |
| | | | 257/618 |
| 2018/0190542 A1 | 7/2018 | Martinez et al. | |

* cited by examiner

PLASMA DICING METHOD

CROSS-REFERENCE TO RELATED APPLICATION

This application is based on and claims priority under 35 U.S.C. § 119 to Korean Patent Application No. 10-2019-0082230, filed on Jul. 8, 2019, in the Korean Intellectual Property Office, the disclosure of which is incorporated herein in its entirety by reference.

BACKGROUND

1. Field

The disclosure relates to plasma dicing methods.

2. Description of the Related Art

A plasma dicing method is a method of dividing (or dicing) a semiconductor wafer by selectively etching, by plasma, a region not covered with a mask.

The use of the plasma dicing method may implement a high etch rate while minimizing damage to a dicing region, in comparison with other dicing methods such as a saw dicing method and a laser dicing method.

Examples of the plasma dicing method include a Dicing Before Grinding (DBG) method and a Dicing After Grinding (DAG) method.

The DAG method includes first performing grinding to thin a semiconductor wafer and then attaching the thinned semiconductor wafer to a carrier and performing plasma etching to divide the semiconductor wafer into a plurality of devices.

The DBG method includes first performing plasma dicing and then grinding and removing a portion not removed by plasma etching to divide a semiconductor wafer into a plurality of devices. The semiconductor wafer may be attached to and supported by the carrier during performance of the dicing.

In the DAG method and the DBG method, an operation of removing the semiconductor wafer or a plurality of devices from the carrier is required in the process of singulating (or dividing) the semiconductor wafer into a plurality of devices.

The semiconductor wafer may be damaged in the operation of removing the semiconductor wafer or a plurality of devices from the carrier.

Meanwhile, a device divided from the semiconductor wafer may have a structure without mechanical movement or may have a structure requiring mechanical movement. For example, the device may have a membrane capable of vibrating vertically. The device having the membrane may be more vulnerable to damage in the dicing operation.

SUMMARY

Provided are plasma dicing methods that may prevent a membrane included in a device from being damaged in the process of dividing a semiconductor wafer into a plurality of devices.

Additional aspects will be set forth in part in the description which follows and, in part, will be apparent from the description, or may be learned by practice of the presented embodiments of the disclosure.

According to an aspect of the disclosure, there is provided a plasma dicing method comprising: providing a semiconductor wafer including a plurality of membrane structures arranged on a first surface of a substrate and spaced apart from each other; performing a first plasma etching process on the first surface of the substrate such that at least one trench is formed at the first surface of the substrate exposed between the plurality of membrane structures; forming a passivation layer on the semiconductor wafer to cover the plurality of membrane structures and the at least one trench; performing a second plasma etching process on a second surface of the substrate opposite to the first surface of the substrate such that a through hole exposing a portion of the plurality of membrane structures and a dicing lane connected to the at least one trench are formed on the second surface of the substrate, the dicing lane having a first width less than a second width of the through hole; and removing the passivation layer and dividing the semiconductor wafer into a plurality of devices, each of the plurality of devices including a membrane structure, among plurality of membrane structure, partially exposed by the through hole.

A first etch rate of the through hole may be higher than a second etch rate of the dicing lane.

The first width of the dicing lane may correspond to a width of the at least one trench.

The second width of the through hole may be about 50 times to about 500 times the first width of the dicing lane.

A depth of the at least one trench may be based on a difference between the second width of the through hole and the first width of the dicing lane.

The removing the passivation layer may comprise performing a dry etching process to remove the passivation layer.

A plurality of dicing lanes may be formed at the first surface of the substrate exposed between the plurality of membrane structures.

The plasma dicing method may further comprise arranging the semiconductor wafer on a jig including a plurality of protrusion portions arranged at certain intervals, the semiconductor wafer including the substrate with the through hole and the dicing lane formed therein.

The substrate may be divided by the dicing lane into a support portion supporting the membrane structure and an edge portion arranged around the support portion, and the semiconductor wafer may be arranged on the jig such that the edge portion of the substrate is arranged on one of the plurality of protrusion portions.

When the passivation layer is removed with the semiconductor wafer arranged on the jig, the plurality of devices, each including the membrane structure, may be located in a space between the plurality of protrusion portions.

The intervals between the plurality of protrusion portions may be greater than a width of each of the plurality of devices.

The plasma dicing method may further comprise arranging a cover on the jig to store each of the plurality of device including the membrane structure.

A shape of the plurality of devices may include at least one of a polygonal shape, an elliptical shape, or a circular shape.

According to another aspect of the disclosure, there is provided a plasma dicing method comprising: providing a semiconductor wafer including a plurality of membrane structures arranged on a first side of a substrate; performing a first plasma etching process on the first side of the substrate to form one or more trenches between each or the plurality of membrane structures; forming a passivation layer to cover the plurality of membrane structures and the one or more trenches; performing a second plasma etching process on a second side of the substrate different from the first side of the substrate to form a first opening at a region on the substrate corresponding to each of the plurality of membrane structures and a second opening corresponding to each of the one or more trenches, the first opening having a first width greater than a second width of the second opening, and the first opening having a first height greater than a second height of the second opening; and removing the passivation layer and dividing the semiconductor wafer into a plurality of devices.

The first opening may expose a portion of the respective membrane structure at the second side of the substrate.

The second opening may expose a portion of the respective one or more trenches at the second side of the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
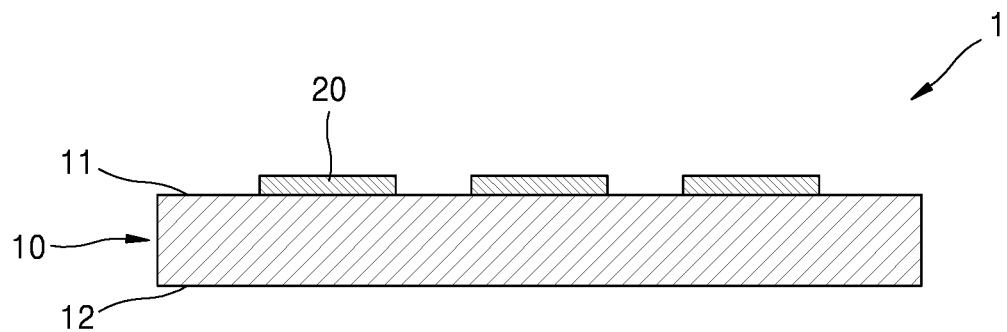
FIGS. 1A to 1F schematically illustrate a plasma dicing method according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Figure 1B:
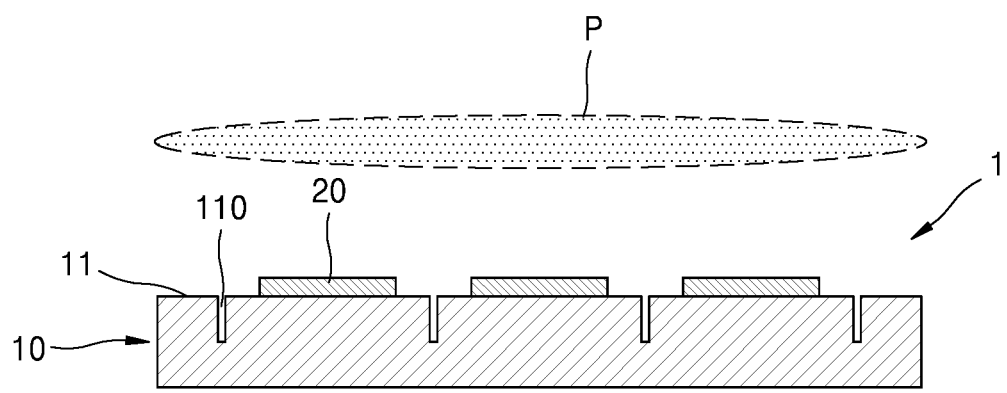
Figure 2:
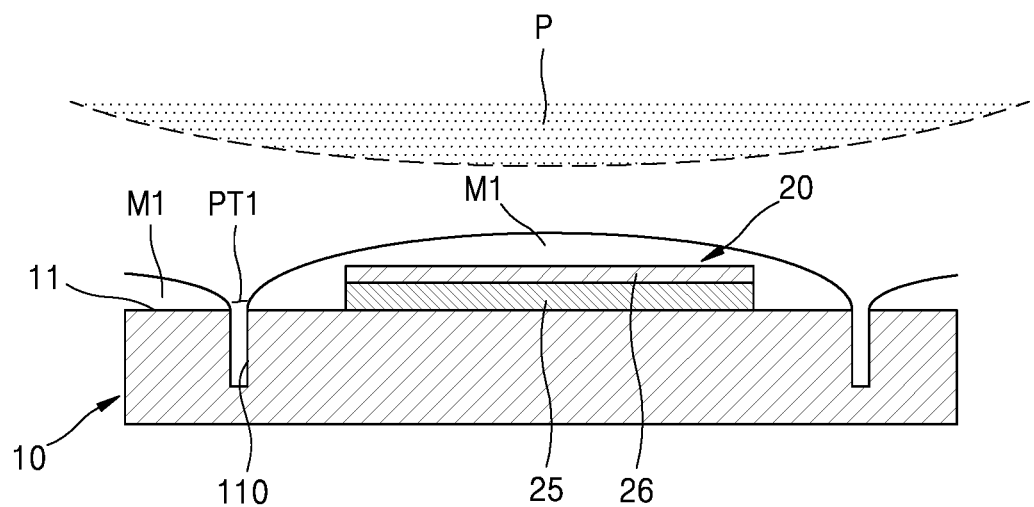
FIG. 2 illustrates a detailed example of the illustration in FIG. 1B.
Figure 3:
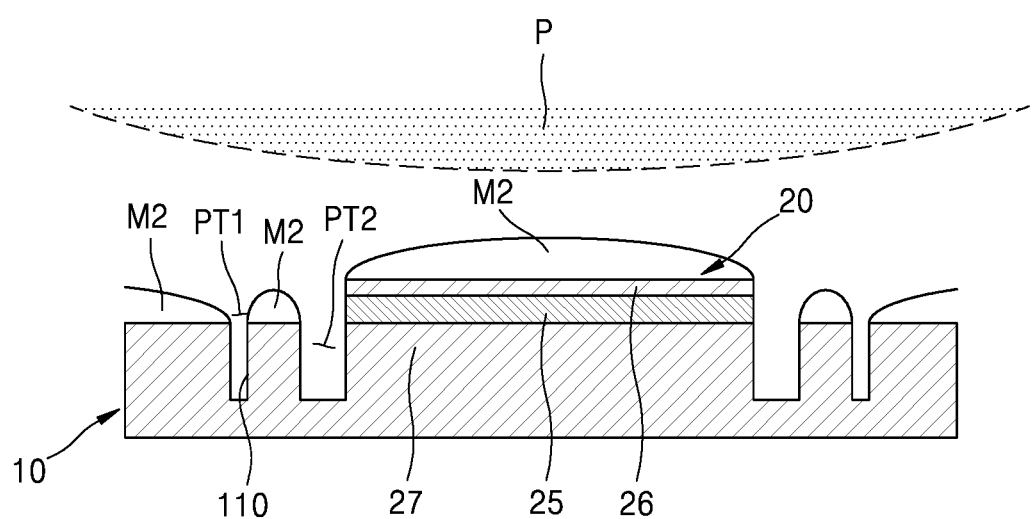
FIG. 3 illustrates another detailed example of the illustration in FIG. 1B.

FIGS. 1A to 1F schematically illustrate a plasma dicing method according to an embodiment. FIG. 2 illustrates an example of FIG. 1B, and FIG. 3 illustrates another example of FIG. 1B. For convenience of description, the illustration of a mask M1 (shown in FIGS. 2 and 3) used for plasma etching will be omitted in FIGS. 1A to 1F.

Referring to FIG. 1A, a semiconductor wafer 1 in which a plurality of membrane structures 20 are arranged to be spaced apart from each other on a first surface 11 of a substrate 10 may be provided.

The substrate 10 may include a silicon substrate. For example, the substrate 10 may include a silicon-on-insulator (SOI) substrate. However, the material of the substrate 10 is not limited thereto, and various materials may be used therein.

The plurality of membrane structures 20 may be arranged on the first surface 11 of the substrate 10. The plurality of membrane structures 20 may be arranged at certain intervals on the first surface 11 of the substrate 10.

Each of the plurality of membrane structures 20 may have a structure in which a plurality of layers are stacked. Each of the plurality of layers may include at least one of a metal material, a dielectric material, and silicon.

The plurality of layers of the membrane structure 20 may include different materials. As an example, in the membrane structure 20, one layer 25 may include a metal material and another layer 26 may include a dielectric material, as illustrated in FIG. 2. As another example, in the membrane structure 20, one layer 27 may include silicon, another layer 25 may include a metal material, and another layer 26 may include a dielectric material, as illustrated in FIG. 3.

Referring to FIG. 1B, plasma etching P may be performed on the first surface 11 of the substrate 10. By the plasma etching P, trenches 110 may be formed in regions where the plurality of membrane structures 20 are not arranged on the first surface 11 of the substrate 10. For example, on the first surface 11 of the substrate 10, the trenches 110 may be formed in a region arranged between the plurality of membrane structures 20 and in a region arranged around the membrane structures 20, respectively.

By using a plasma etching method as a method of forming the trench 110, a planar pattern PT1 of the trench 110 may be variously implemented in comparison with other etching methods such as a laser dicing method and a saw dicing method. For example, the planar pattern PT1 of the trench 110 may be polygonal, elliptical, or circular.

Although not illustrated in detail in FIG. 1B, referring to FIG. 2, a mask M1 having a shape corresponding to the planar pattern PT1 of the trench 110 may be formed before performance of plasma etching P and the mask M1 may be removed after performance of plasma etching P.

In the above embodiment, the description has been focused on an example in which a separate plasma etching process is performed to form the trench 110 at the first surface 11 of the substrate 10. However, a plasma etching process for forming the trench 110 may be performed together with other processes, not as a separate process.

For example, as illustrated in FIG. 3, at least one layer 27 among a plurality of layers 25, 26, and 27 of the membrane structure 20 may include silicon. A plasma etching process may be used as a method of forming a pattern PT2 at the layer 27. In this case, a mask M2 having a shape corresponding to the planar pattern PT2 of the trench 110 and the pattern PT2 of the membrane structure 20 may be formed before performance of plasma etching P and the mask M2 may be removed after performance of plasma etching P. The etching process for forming the trench 110 may be performed together in the plasma etching process for forming the pattern PT2 of the membrane structure 20.

Figure 1C:
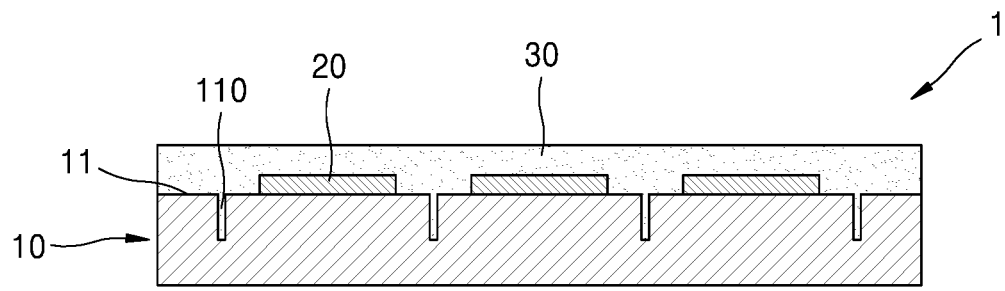

Referring to FIG. 1C, a passivation layer 30 may be formed on the semiconductor wafer 1. The passivation layer 30 may cover the first surface 11 of the substrate 10, the plurality of membrane structures 20, and the trenches 110. The trench 110 may be filled with a portion of the passivation layer 30.

The material of the passivation layer 30 may include a photoresist, a silicon oxide, or a silicon nitride. However, the material of the passivation layer 30 is not limited thereto and may vary within the range capable of protecting the membrane structure 20 from plasma during performance of the plasma etching process.

The passivation layer 30 may be deposited to a certain thickness along the shape of the semiconductor wafer 1 with the trenches 110 formed therein. For example, the passivation layer 30 may include a film capable of uniform physical vapor deposition coating.

Figure 1D:
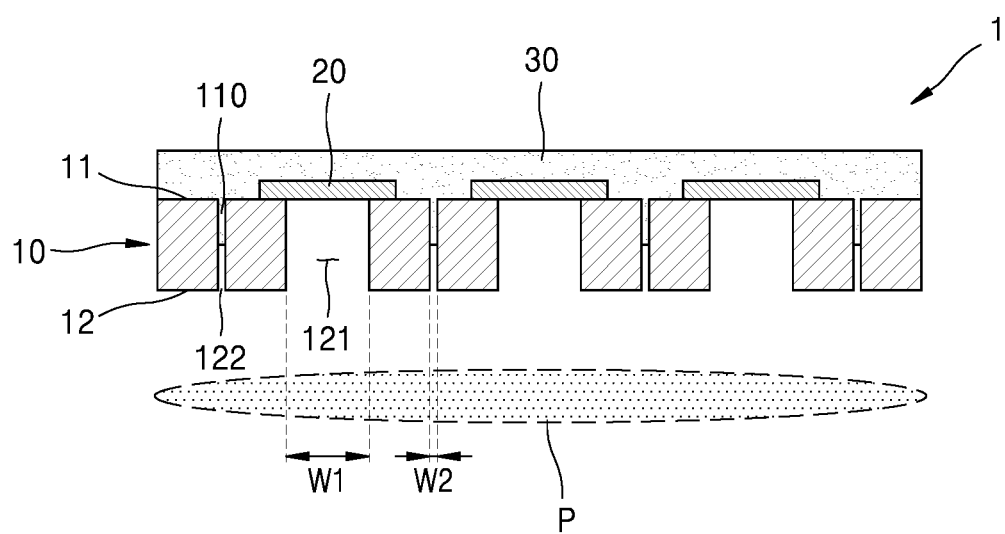

Referring to FIG. 1D, plasma etching P may be performed on a second surface 12 opposite to the first surface 11 of the substrate 10.

Although not illustrated in the drawings, a mask having a pattern corresponding to a through hole 121 and a dicing lane 122 may be formed on the second surface 12 of the substrate 10 before performance of the plasma etching P and the mask may be removed after performance of the plasma etching P.

By plasma etching P, a through hole 121 exposing a portion of the plurality of membrane structures 20 and a dicing lane 122 connected to the trench 110 and having a width less than the width of the through hole 121 may be simultaneously formed at the substrate 10.

According to an embodiment, a width W1 of the through hole 121 may larger than a width W2 of the dicing lane 122. According to an embodiment, the width W1 of the through hole 121 may be about 50 times to about 500 times the width W2 of the dicing lane 122. As such, because the width W1 of the through hole 121 is greater than the width W2 of the dicing lane 122, an etch rate with respect to a portion of the substrate 10 corresponding to the through hole 121 (hereinafter referred to as a "first portion") may be higher than an etch rate with respect to a second portion of the substrate 10 corresponding to the dicing lane 122 (hereinafter referred to as a "second portion"). That is, an etch rate of the through hole 121 may be higher than an etch rate of the dicing lane 122. Accordingly, a depth to which etching is performed at the first portion of the substrate 10 may be greater than a depth to which etching is performed at the second portion of the substrate 10.

If the trench 110 is not formed at the substrate 10, when the through hole 121 passing through the substrate 10 is formed, the second portion of the substrate 10 corresponding to the dicing lane 122 having a low etch rate may remain unremoved. In this case, when the plasma etching process time is increased in order to form the dicing lane 122 passing through the substrate 10, the membrane structure 20 exposed by the through hole 121 may be damaged or degraded by plasma P.

However, according to one or more embodiments of the disclosure, because the trench 110 with a certain depth is formed at the substrate 10, the dicing lane passing through the substrate 10 may be formed without damaging or degrading the membrane structure 20.

Even when an etch rate with respect to the second portion of the substrate 10 is lower than an etch rate with respect to the first portion of the substrate 10, because the trench 110 with a certain depth is formed at the substrate 10, the dicing lane 122 may be formed simultaneously with the through hole 121 or may be formed before the through hole 121.

In the process of forming the dicing lane 122, the second portion of the substrate 10 corresponding to the dicing lane 122 may be removed by the plasma P and the passivation layer 30 filling the trench 110 may be exposed to the plasma P.

The width W2 of the dicing lane 122 may correspond to the width of the trench 110. The width W1 of the through hole 121 may be about 50 times to about 500 times the width of the trench 110.

Referring back to FIG. 1B, the depth of the trench 110 may be determined by considering the difference between the etch rate with respect to the first portion of the substrate 10 and the etch rate with respect to the second portion of the substrate 10. The difference between the etch rate with respect to the first portion of the substrate 10 and the etch rate with respect to the second portion of the substrate 10 may vary according to the difference between the width W1 of the through hole 121 and the width W2 of the dicing lane 122. Accordingly, the depth of the trench 110 may be determined by considering the difference between the width W1 of the through hole 121 and the width W2 of the dicing lane 122. For example, when the difference between the width W1 of the through hole 121 and the width W2 of the dicing lane 122 is expected to be great, the depth of the trench 110 may be formed to be large.

Figure 1E:
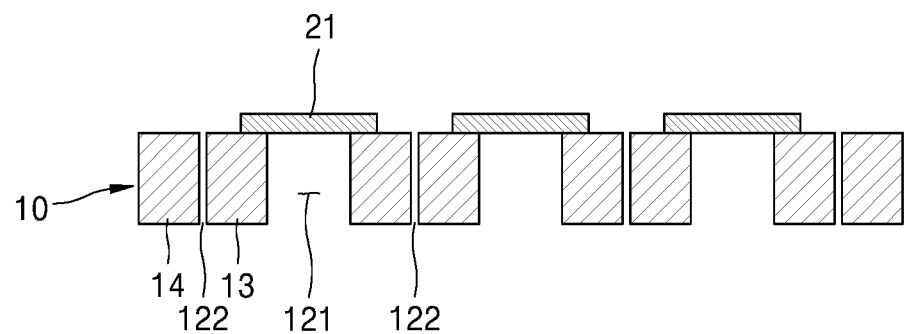
Figure 1F:
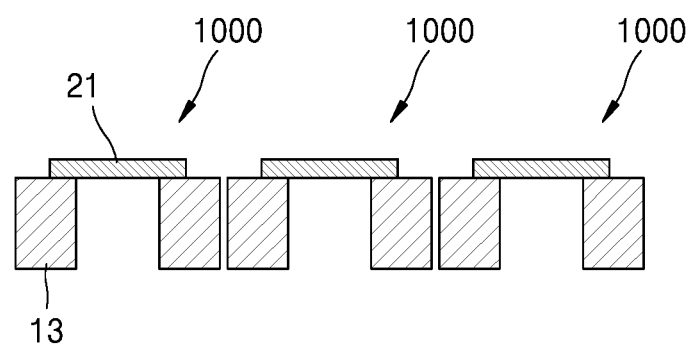

Referring to FIGS. 1E and 1F, the passivation layer 30 may be removed from the semiconductor wafer 1. Dry etching may be used to remove the passivation layer 30.

When wet etching is used to remove the passivation layer 30, a portion of the membrane structure 20 may be exposed through the through hole 121 and the membrane structure 20 may be damaged accordingly.

On the other hand, according to one or more embodiments of the disclosure, dry etching may be used to remove the passivation layer 30, thereby preventing the membrane structure 20 from being damaged in the process of removing the passivation layer 30.

By removing the passivation layer 30 from the semiconductor wafer 1, the semiconductor wafer 1 may be singulated into a plurality of devices 1000 divided by the dicing lane 122.

Each of the plurality of devices 1000 may have a structure in which a portion of a membrane 21 is exposed by the through hole 121. Each of the plurality of devices 1000 may have a membrane 21 that is vibratably supported by a support portion 13.

An edge portion 14 of the substrate 10 surrounding the plurality of devices 1000 may be removed from the plurality of devices 1000.

FIGS. 4A to 4F schematically illustrate a plasma dicing method according to another embodiment.

Figure 4A:
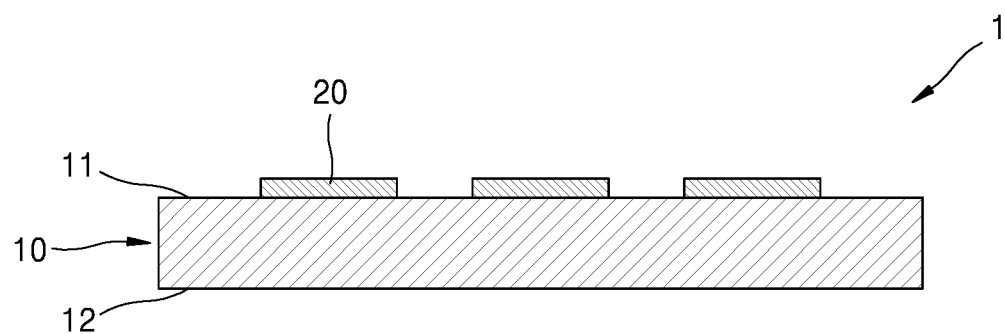
FIGS. 4A to 4F schematically illustrate a plasma dicing method according to another embodiment.

Referring to FIG. 4A, a semiconductor wafer 1 in which a plurality of membrane structures 20 are arranged to be spaced apart from each other on a first surface 11 of a substrate 10 may be provided.

The substrate 10 may include a silicon substrate. For example, the substrate 10 may include an SOI substrate. However, the material of the substrate 10 is not limited thereto, and various materials may be used therein.

The plurality of membrane structures 20 may be arranged on the first surface 11 of the substrate 10. The plurality of membrane structures 20 may be arranged at certain intervals on the first surface 11 of the substrate 10.

Each of the plurality of membrane structures 20 may have a structure in which a plurality of layers are stacked. Each of the plurality of layers may include at least one of a metal material, a dielectric material, and silicon.

Figure 4B:
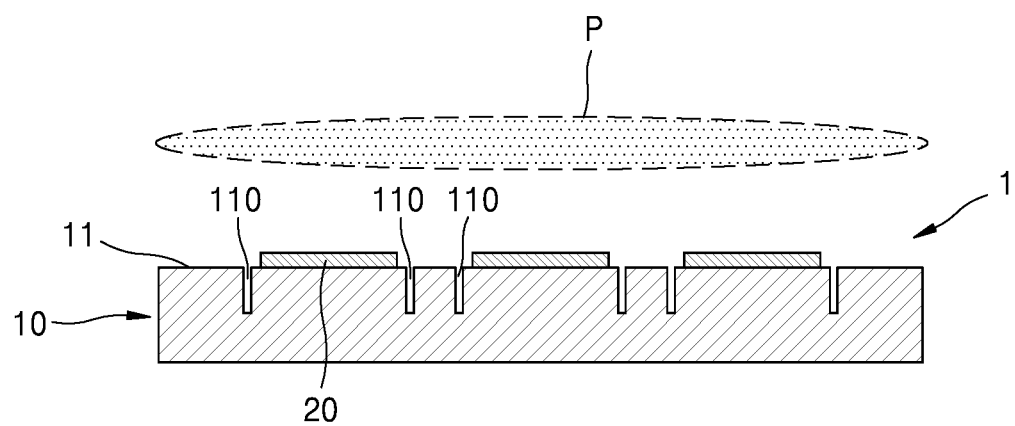

Referring to FIG. 4B, plasma etching P may be performed on the first surface 11 of the substrate 10. By the plasma etching P, at least one trench 110 may be formed in a region where the plurality of membrane structures 20 are not arranged on the first surface 11 of the substrate 10. For example, on the first surface 11 of the substrate 10, two trenches 110 may be formed in a region between the plurality of membrane structures 20 and one trench 110 may be formed in a region around the membrane structure 20.

Figure 4C:
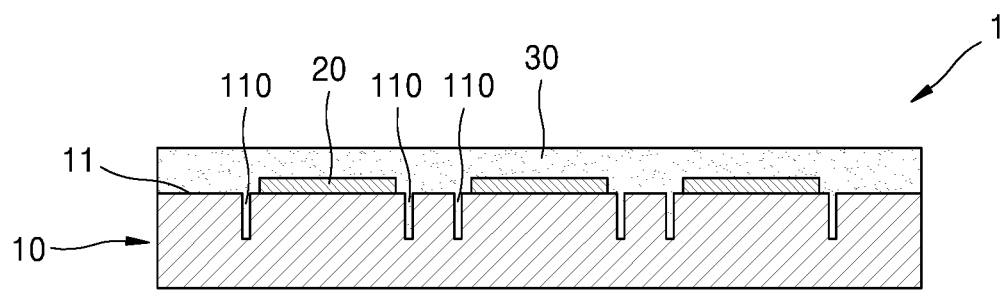

Referring to FIG. 4C, a passivation layer 30 may be formed on the semiconductor wafer 1. The passivation layer 30 may cover the first surface 11 of the substrate 10, the plurality of membrane structures 20, and the trenches 110. The trench 110 may be filled with a portion of the passivation layer 30.

Figure 4D:
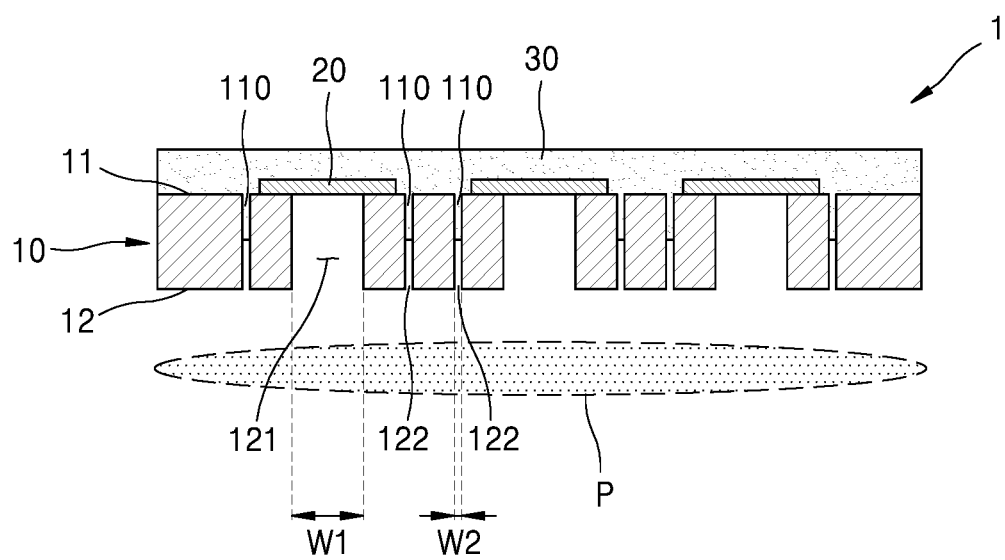

Referring to FIG. 4D, plasma etching P may be performed on a second surface 12 opposite to the first surface 11 of the substrate 10.

By the plasma etching P, a through hole 121 exposing a portion of the plurality of membrane structures 20 and a dicing lane 122 having a width W2 less than a width W1 of the through hole 121 may be simultaneously formed at the substrate 10.

The width W1 of the through hole 121 may be about 50 times to about 500 times the width W2 of the dicing lane 122. An etch rate with respect to a first portion of the substrate 10 corresponding to the through hole 121 may be higher than an etch rate with respect to a second portion of the substrate 10 corresponding to the dicing lane 122.

The width W2 of the dicing lane 122 connected to the trench 110 may correspond to the width of the trench 110. The width W1 of the through hole 121 may be about 50 times to about 500 times the width of each of the trenches 110.

Figure 4E:
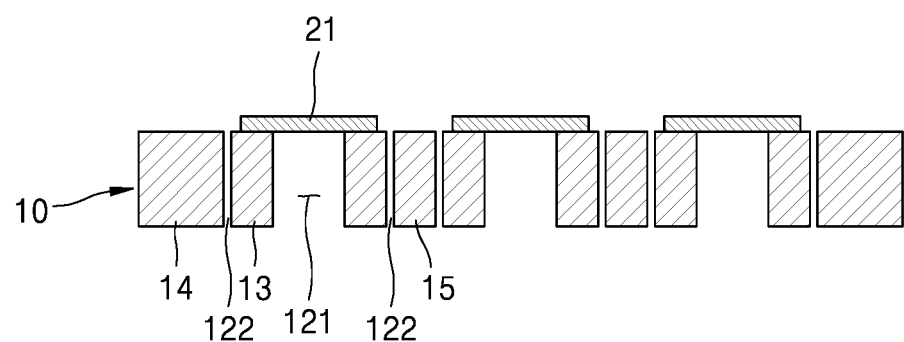
Figure 4F:
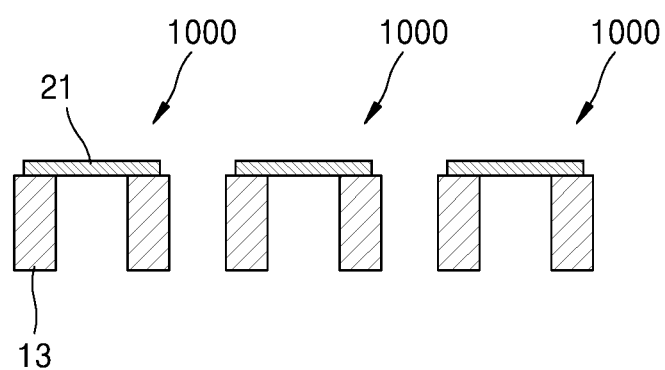

Referring to FIGS. 4E and 4F, the passivation layer 30 may be removed from the semiconductor wafer 4. Dry etching may be used to remove the passivation layer 30.

By removing the passivation layer 30, the semiconductor wafer 1 may be singulated into a plurality of devices 1000 divided by the dicing lane 122.

Each of the plurality of devices 1000 may have a structure in which a portion of a membrane 21 is exposed by the through hole 121. Each of the plurality of devices 1000 may have a membrane 21 that is vibratably supported by a support portion 13.

Edge portions 14 and 15 of the substrate 10 surrounding the plurality of devices 1000 may be removed from the plurality of devices 1000.

FIGS. 5A to 5H schematically illustrate a plasma dicing method according to another embodiment.

Because the plasma dicing method illustrated in FIGS. 5A to 5D is the same as the plasma dicing method illustrated in FIGS. 4A to 4D, redundant descriptions thereof will be omitted for conciseness.

Figure 5A:
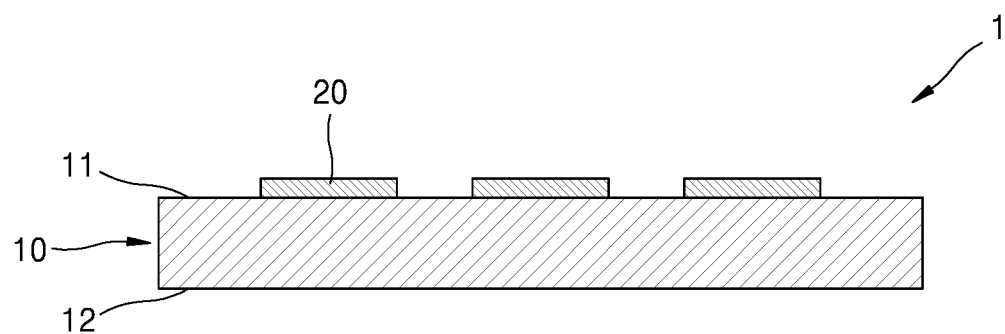
FIGS. 5A to 5H schematically illustrate a plasma dicing method according to another embodiment.
Figure 5B:
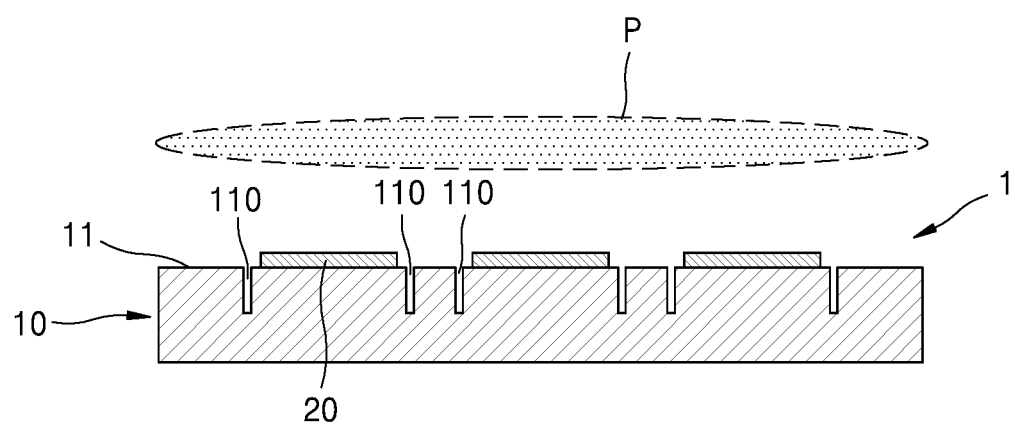
Figure 5C:
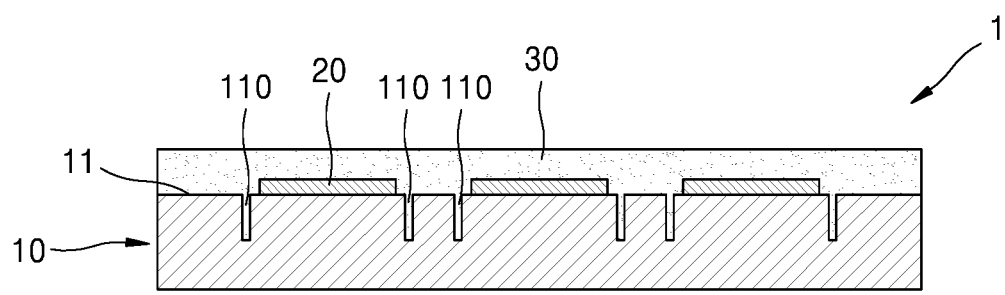
Figure 5D:
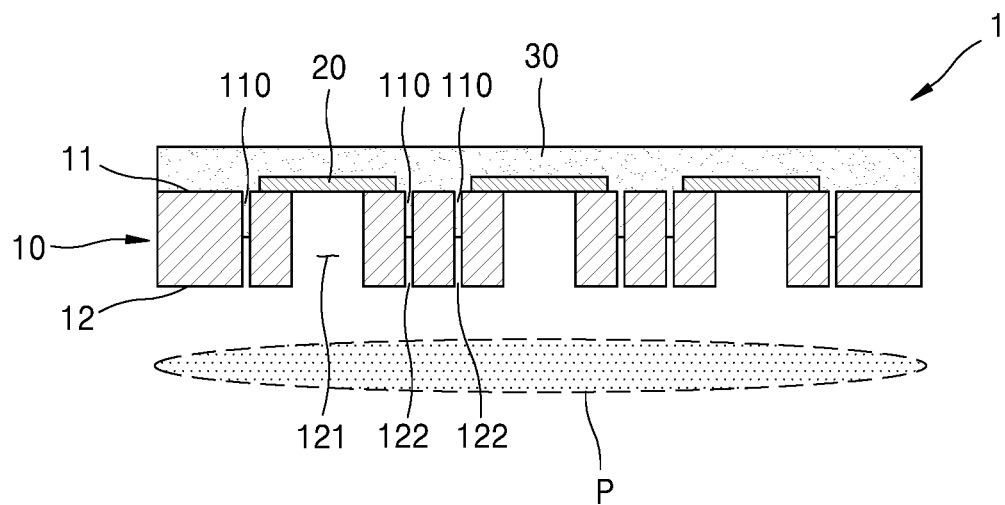
Figure 5E:
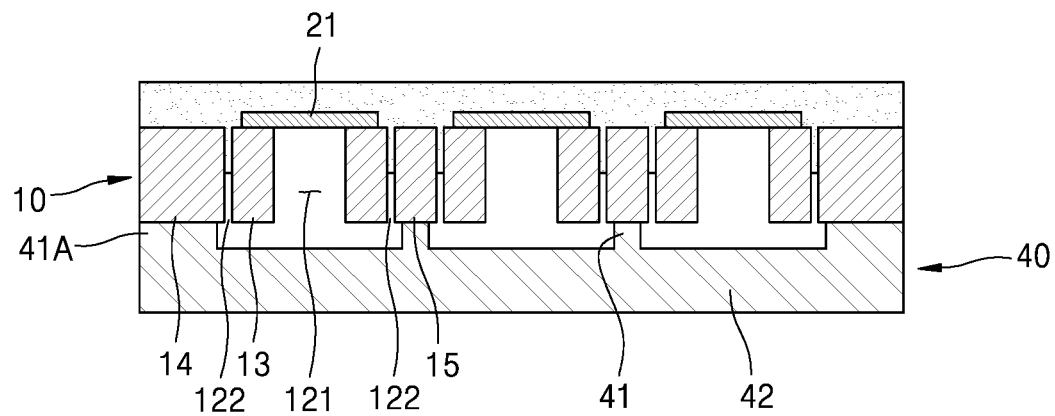

Referring to FIG. 5E, a jig 40 having a plurality of protrusion portions 41 and 41A arranged at certain intervals may be prepared. The jig 40 may include a base 42 and protrusion portions 41 and 41A protruding from the base 42.

A semiconductor wafer 1 with a through hole 121 and a dicing lane 122 formed therein may be arranged on the jig 40. For example, the semiconductor wafer 1 may be arranged such that the dicing lane 122 does not overlap the protrusion portions 41 and 41A of the jig 40.

The substrate 10 may be divided by the dicing lane 122 into a support portion 13 supporting a membrane structure 20 and edge portions 14 and 15 arranged around the support portion 13. The edge portions 14 and 15 may be arranged on the protrusion portions 41 and 41A.

Figure 5F:
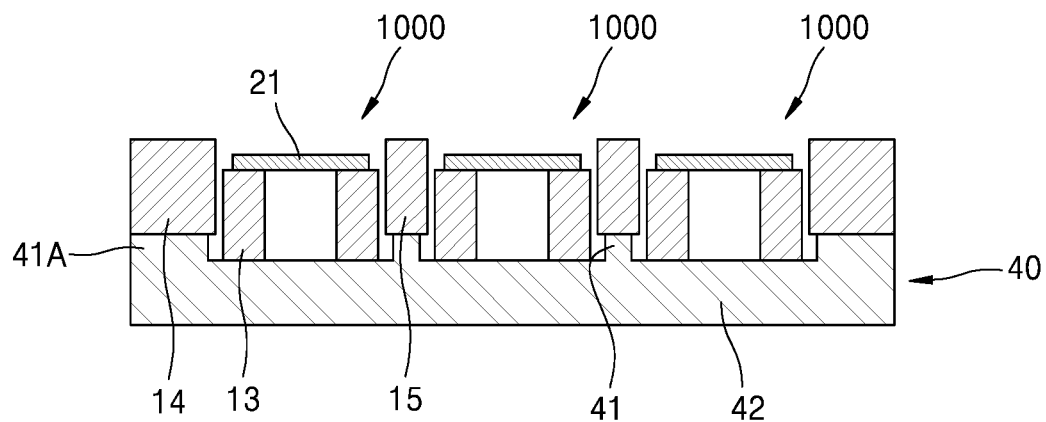

Referring to FIG. 5F, a passivation layer 30 may be removed from the semiconductor wafer 1.

Because the support portion 13 is not supported by the protrusion portions 41 and 41A, as the passivation layer 30 is removed, a plurality of devices 1000 having a membrane 21 may move downward by the weight thereof. The membrane structure 20 with the passivation layer 30 removed therefrom may be defined as the membrane 21.

The plurality of devices 1000 having the membrane 21 may be located in a space between the protrusion portions 41 and 41A. The interval between the protrusion portions 41 and 41A may be greater than the width of each of the plurality of devices 1000.

The plurality of devices 1000 having the membrane 21 may be separated from the edge portions 14 and 15 that are portions of the substrate 10 surrounding the plurality of devices 1000.

As shown above, by using the jig 40 having the protrusion portions 41 and 41A, the plurality of devices 1000 may be easily separated from a portion of the substrate 10 in the process of removing the passivation layer 30. Also, the protrusion portions 41 and 41A may restrict the horizontal movement of the plurality of devices 1000 having the membrane 21.

Figure 5G:
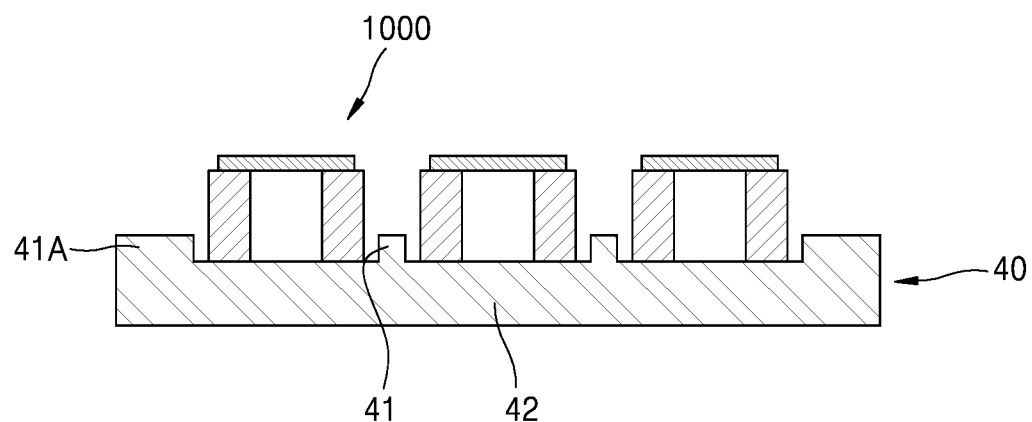

Referring to FIG. 5G, the edge portions 14 and 15 of the substrate 10 surrounding the plurality of devices 1000 may be removed from the jig 40.

Figure 5H:
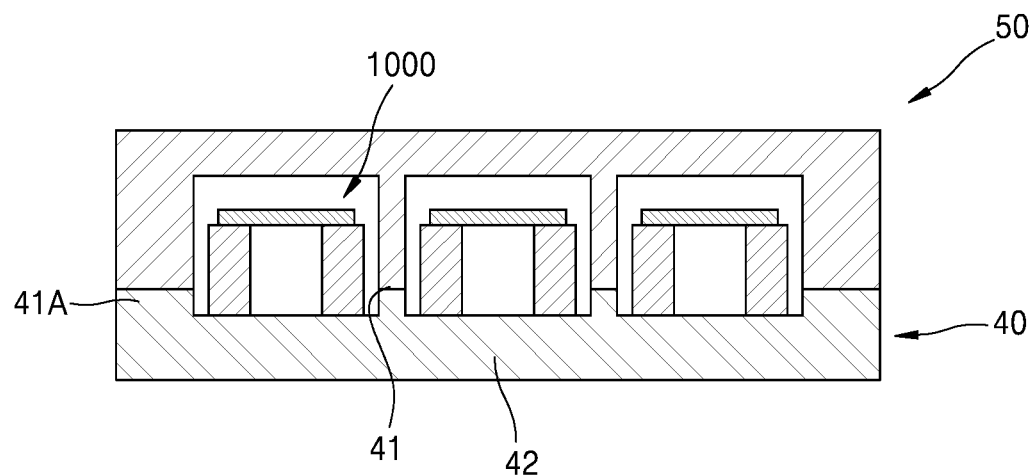

Referring to FIG. 5H, a cover 50 may be arranged on the jig 40. Accordingly, the movement and storage of the device 1000 having the membrane 21 may be easy. This may enable a continuous progression to a subsequent process such as a wire bonding or packaging process performed after the dicing process.

Figure 6:
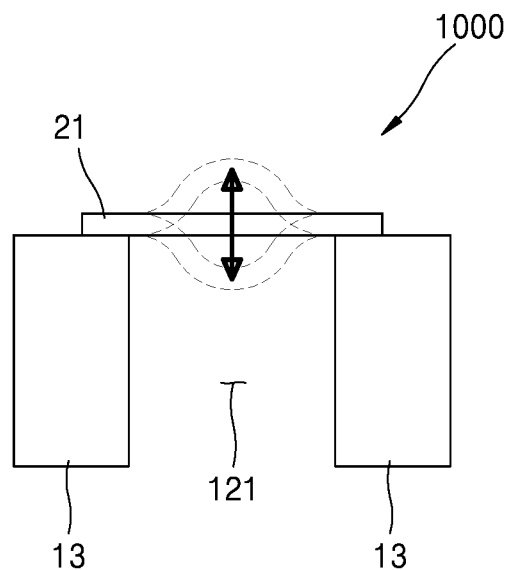
FIG. 6 illustrates an example of a device manufactured by a plasma dicing method.
Figure 7:
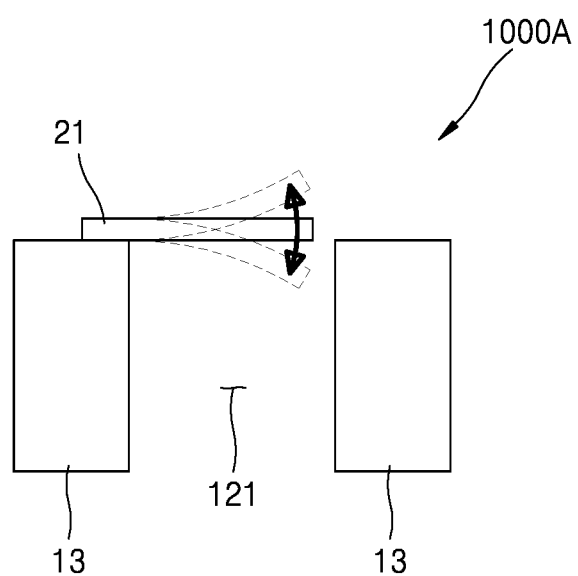
FIG. 7 illustrates another example of a device manufactured by a plasma dicing method.

FIG. 6 illustrates an example of a device 1000 manufactured by a plasma dicing method, and FIG. 7 illustrates another example of a device 1000 manufactured by a plasma dicing method.

Referring to FIG. 6, a device 1000 may include a membrane 21 and a support member 13 supporting both end portions of the membrane 21. A support portion 13 with a passivation layer 30 removed therefrom may be defined as the support member 13.

A portion of the membrane 21 may be exposed by a through hole 121, and the remaining portion of the membrane 21 may be supported by the support member 13. Accordingly, a portion of the membrane 21 exposed in the through hole 121 may vibrate in the vertical direction.

Referring to FIG. 7, a device 1000A may have a structure in which one end portion of a membrane 21 is supported by a support member 13. Accordingly, the other end portion of the membrane 21 may vibrate in the vertical direction.

Because the membrane 21 has a structure capable of vibrating in the vertical direction, the device 1000A may be used as a sensor. As an example, the device 1000A may be used as an acoustic sensor.

Figure 8:
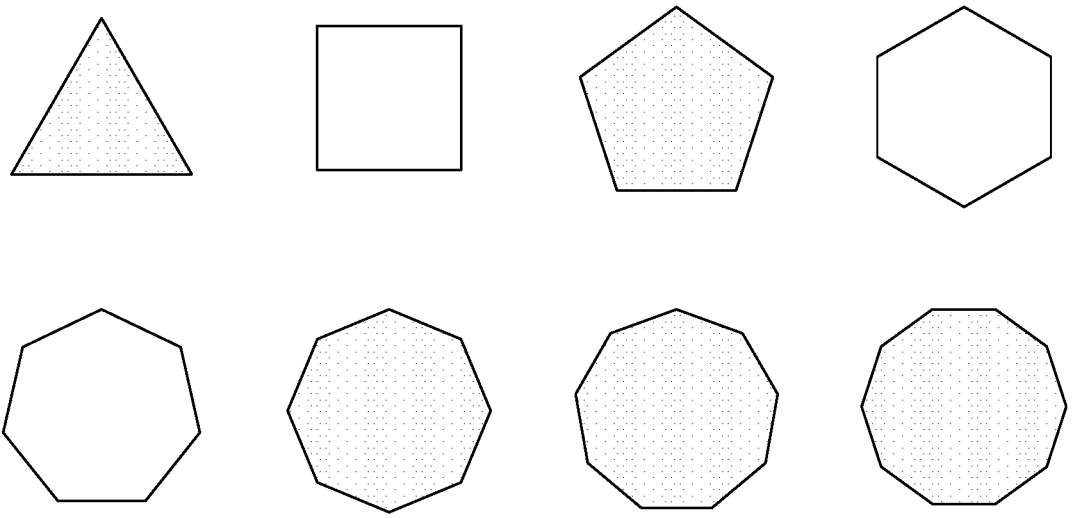
FIGS. 8 and 9 illustrate the shape of a device according to embodiments.
Figure 9:
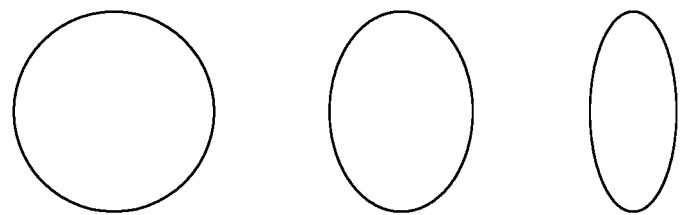
Figure 10:
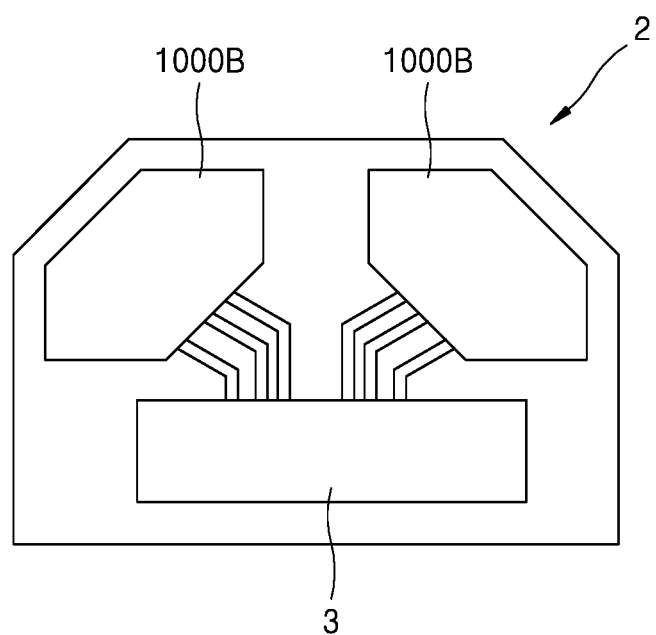
FIG. 10 illustrates an apparatus to which a device according to embodiments is applied.

FIGS. 8 and 9 illustrate the shape of a device 1000 according to embodiments. FIG. 10 illustrates an apparatus to which a device 1000 according to embodiments is applied.

Referring to FIGS. 8 and 9, the device 1000 manufactured by the above plasma dicing method may have various planar shapes. For example, the device 1000 may have a polygonal shape as illustrated in FIG. 8 or may have a circular shape or an elliptical shape as illustrated in FIG. 9.

As such, a device 1000B capable of being implemented in various shapes may be applied to an apparatus 2 having various structures. For example, as illustrated in FIG. 10, the device 1000B may also be easily arranged in the apparatus 2 having a space constraint such as another component. The device 1000B may be electrically connected to another component such as an integrated circuit 3.

The plasma dicing methods according to the embodiments may prevent a membrane included in a device from being damaged in the process of dividing a semiconductor wafer into a plurality of devices.

Example embodiments of plasma dicing methods and devices manufactured thereby have been described above and illustrated in the accompanying drawings in order to facilitate the understanding of the disclosure. However, it should be understood that the embodiments are merely illustrative of the disclosure and are not intended to limit the scope of the disclosure. Also, it is to be understood that the disclosure is not limited to the illustrated and described embodiments. This is because various other modifications may occur to those of ordinary skill in the art.

What is claimed is:

1. A plasma dicing method comprising:
providing a semiconductor wafer including a plurality of membrane structures arranged on a first surface of a substrate and spaced apart from each other;
performing a first plasma etching process on the first surface of the substrate such that at least one trench is formed at the first surface of the substrate exposed between the plurality of membrane structures;
forming a passivation layer on the semiconductor wafer to cover the plurality of membrane structures and the at least one trench;
performing a second plasma etching process on a second surface of the substrate opposite to the first surface of the substrate such that a through hole exposing a portion of the plurality of membrane structures and a dicing lane connected to the at least one trench are formed on the second surface of the substrate, the dicing lane having a first width less than a second width of the through hole; and
removing the passivation layer and dividing the semiconductor wafer into a plurality of devices, each of the plurality of devices including a membrane structure, among plurality of membrane structure, partially exposed by the through hole.

2. The plasma dicing method of claim 1, wherein a first etch rate of the through hole is higher than a second etch rate of the dicing lane.

3. The plasma dicing method of claim 1, wherein the first width of the dicing lane corresponds to a width of the at least one trench.

4. The plasma dicing method of claim 1, wherein the second width of the through hole is about 50 times to about 500 times the first width of the dicing lane.

5. The plasma dicing method of claim 1, wherein a depth of the at least one trench is based on a difference between the second width of the through hole and the first width of the dicing lane.

6. The plasma dicing method of claim 1, wherein the removing the passivation layer comprising performing a dry etching process to remove the passivation layer.

7. The plasma dicing method of claim 1, wherein a plurality of dicing lanes are formed at the first surface of the substrate exposed between the plurality of membrane structures.

8. The plasma dicing method of claim 7, further comprising arranging the semiconductor wafer on a jig including a plurality of protrusion portions arranged at certain intervals, the semiconductor wafer including the substrate with the through hole and the dicing lane formed therein.

9. The plasma dicing method of claim 8, wherein the substrate is divided by the dicing lane into a support portion supporting the membrane structure and an edge portion arranged around the support portion, and the semiconductor wafer is arranged on the jig such that the edge portion of the substrate is arranged on one of the plurality of protrusion portions.

10. The plasma dicing method of claim 9, wherein, when the passivation layer is removed with the semiconductor wafer arranged on the jig, the plurality of devices, each including the membrane structure, are located in a space between the plurality of protrusion portions.

11. The plasma dicing method of claim 10, wherein the intervals between the plurality of protrusion portions is greater than a width of each of the plurality of devices.

12. The plasma dicing method of claim 8, further comprising arranging a cover on the jig to store each of the plurality of device including the membrane structure.

13. The plasma dicing method of claim 1, wherein a shape of the plurality of devices includes at least one of a polygonal shape, an elliptical shape, or a circular shape.

14. A plasma dicing method comprising:
providing a semiconductor wafer including a plurality of membrane structures arranged on a first side of a substrate;
performing a first plasma etching process on the first side of the substrate to form one or more trenches between each or the plurality of membrane structures;
forming a passivation layer to cover the plurality of membrane structures and the one or more trenches;
performing a second plasma etching process on a second side of the substrate different from the first side of the substrate to form a first opening at a region on the substrate corresponding to each of the plurality of membrane structures and a second opening corresponding to each of the one or more trenches, the first opening having a first width greater than a second width of the second opening, and the first opening having a first height greater than a second height of the second opening; and
removing the passivation layer and dividing the semiconductor wafer into a plurality of devices.

15. The plasma dicing method of claim 14, wherein the first opening exposes a portion of the respective membrane structure at the second side of the substrate.

16. The plasma dicing method of claim 14, wherein the second opening exposes a portion of the respective one or more trenches at the second side of the substrate.

* * * * *